United States Patent
Lee et al.

(10) Patent No.: US 8,373,955 B2
(45) Date of Patent: Feb. 12, 2013

(54) ELECTROSTATIC DISCHARGE PROTECTION DEVICES

(75) Inventors: Yang-Han Lee, Taoyuan County (TW); Chun Chang, Taipei (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 13 days.

(21) Appl. No.: 12/718,247

(22) Filed: Mar. 5, 2010

(65) Prior Publication Data
US 2010/0226055 A1   Sep. 9, 2010

(30) Foreign Application Priority Data
Mar. 6, 2009   (TW) ................................ 98107261 A

(51) Int. Cl.
| H02H 9/00 | (2006.01) |
| H01C 7/12 | (2006.01) |
| H02H 1/00 | (2006.01) |
| H02H 1/04 | (2006.01) |
| H02H 3/22 | (2006.01) |

(52) U.S. Cl. .......................................... 361/56; 361/118

(58) Field of Classification Search ...................... 361/56
See application file for complete search history.

(56) References Cited

U.S. PATENT DOCUMENTS
6,483,365 B2 * 11/2002 Morishita ...................... 327/314
6,920,026 B2 *  7/2005 Chen et al. ...................... 361/56

* cited by examiner

Primary Examiner — Dharti Patel
(74) Attorney, Agent, or Firm — Muncy, Geissler, Olds & Lowe, PLLC

(57) ABSTRACT

An electrostatic discharge (ESD) protection circuit having first and second transistors and an ESD clamp circuit. The first and second transistors are coupled in series between first and second voltage input pins of a chip. The ESD clamp circuit is coupled between the first and second voltage input pins. The drains of the first and second transistors are coupled to an I/O pin of the chip. The doping regions of the first and second transistors are of distinct doping concentrations. The first transistor comprises four doping regions, and has a source formed by the first and third doping regions, and has a drain formed by the second and the fourth doping regions. The first doping region is within the third doping region. The second doping region is within the fourth doping region. The doping concentration of the fourth doping region is less than that of the third doping concentration.

6 Claims, 5 Drawing Sheets

ELECTROSTATIC DISCHARGE PROTECTION DEVICES

CROSS REFERENCE TO RELATED APPLICATIONS

This application claims priority of Taiwan Patent Application No. 098107261, filed on Mar. 6, 2009, the entirety of which is incorporated by reference herein.

BACKGROUND OF THE INVENTION

1. Field of the Invention

The present invention relates to electrostatic discharge (ESD) protection devices.

2. Description of the Related Art

In a conventional ESD protection method, the I/O pins of a chip are equipped with ESD protection transistors and a PESD layer is fabricated under the drains of the ESD protection transistors. The PESD layer reduces breakdown voltage of the drains of the ESD protection transistors. Thus, for ESD protection transistors utilizing the conventional method, the drain is activated before neighboring areas, and the surfaces of the gate oxide of the ESD protection transistors are protected from being punched through by an ESD current. However, additional costs are added due to the required PESD layer, such as a mask.

BRIEF SUMMARY OF THE INVENTION

An electrostatic discharge protection device is provided, which is coupled between an I/O pin, a first voltage pin and a second voltage pin of a chip. The electrostatic discharge protection device comprises a first transistor, a second transistor and an electrostatic discharge clamp circuit.

The first transistor has a first drain coupled to the I/O pin, a first source coupled to the first voltage pin, and a first gate. The second transistor has a second drain coupled to the I/O pin, a second source coupled to the second voltage pin, and a second gate. The electrostatic discharge clamp circuit is coupled between the first and second voltage pins.

The electrostatic discharge protection device of the invention controls a current path of electrostatic discharge current by using distinct doping concentrations to form the semiconductor structure of the first transistor or the second transistor.

In an exemplary embodiment of the electrostatic discharge protection device of the invention, the construction of the first drain and first source of the first transistor is specially designed. The first transistor comprises a first, a second, a third and a fourth doping region. The first and third doping regions form the first source of the first transistor. The second and fourth doping regions form the first drain of the first transistor. To form the first source, the doping depth of the third doping region is more than that of the first doping region, and the doping concentration of the third doping region is less than that of the first doping region. To form the first drain, the doping depth of the fourth doping region is more than that of the second doping region, and the doping concentration of the fourth doping region is less than that of the second doping region. In the embodiment, the doping concentration of the fourth doping region is designed to be less than that of the third doping region.

In a case wherein the first and second voltage pins are operative to couple a high voltage supply and a low voltage supply, respectively, the first transistor may be a p-type transistor and the third and fourth doping regions thereof may include a p-grade and a p-well, respectively.

In a case wherein the first and second voltage pins are operative to couple a low voltage supply and a high voltage supply, respectively, the first transistor may be an n-type transistor and the third and fourth doping regions thereof may include an n-grade and an n-well, respectively.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1A:
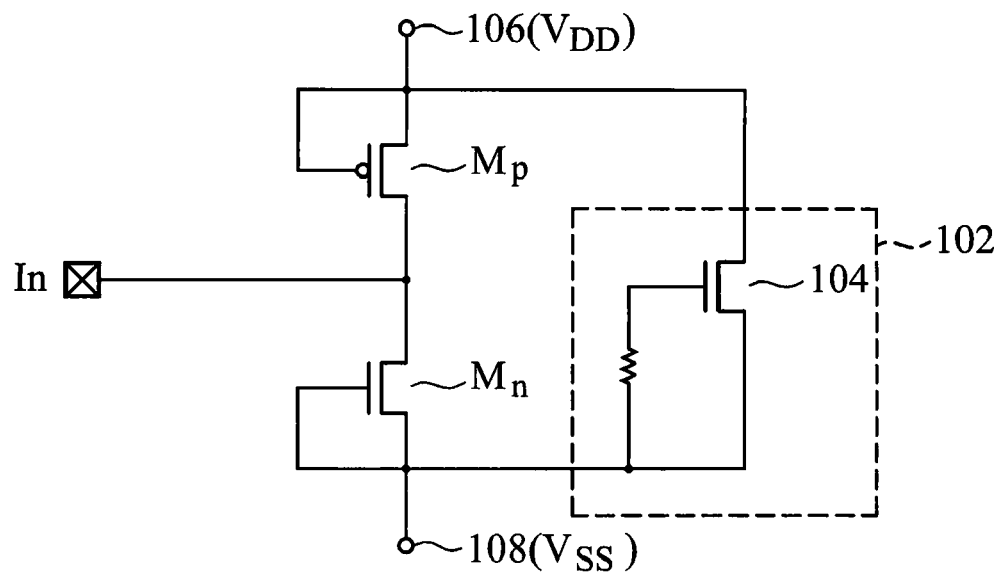
FIG. 1A depicts an ESD protection device for input pins of a chip.
Figure 1B:
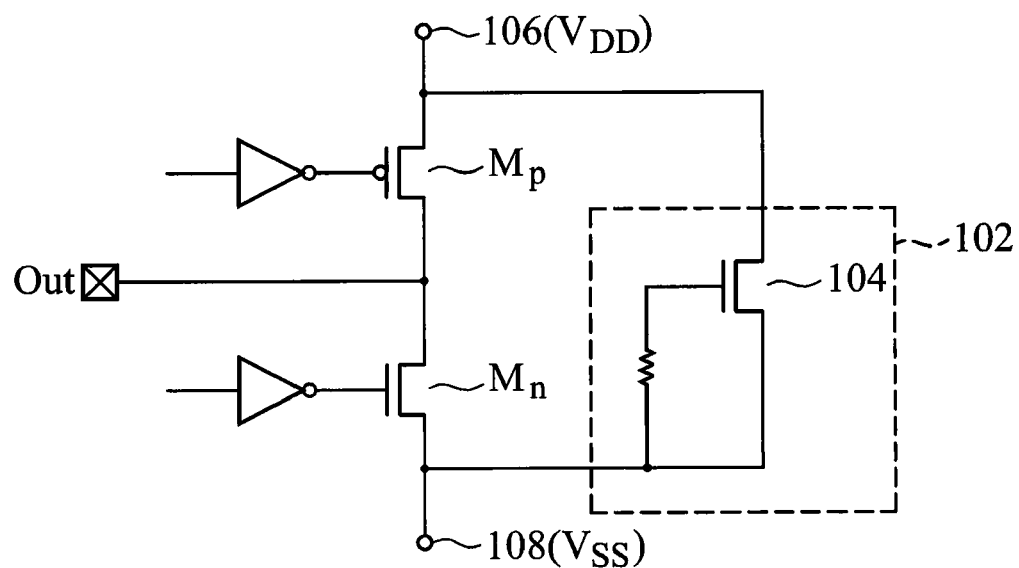
FIG. 1B depicts an ESD protection device for output pins of a chip.

FIGS. 1A and 1B depict two exemplary embodiments of the ESD protection devices of the invention.

The ESD protection device shown in FIG. 1A is designed for input pins of a chip. As shown, the ESD protection device comprises a p-type transistor $M_p$, an n-type transistor $M_n$, and an ESD clamp circuit 102. Referring to the p-type transistor $M_p$, the drain is coupled to an input pin In of the chip, and the source is coupled to a voltage pin 106 that is operative to receive a high voltage supply $V_{DD}$. Referring to the n-type transistor $M_n$, the drain is coupled to the input pin In and the source is coupled to a voltage pin 108 that is operative to receive a low voltage supply $V_{SS}$. The ESD clamp circuit 102 is coupled between the voltage pins 106 and 108.

The ESD protection device shown in FIG. 1B is designed for output pins of a chip. There are some differences between FIGS. 1A and 1B. In FIG. 1B, the p-type transistor $M_p$ and n-type transistor $M_n$ are coupled to an output pin Out of a chip and the gates do not directly connect with the sources.

The ESD clamp circuit 102 shown in FIGS. 1A and 1B comprises a transistor 104. The transistor 104 is coupled between the voltage pins 106 and 108. The size of the transistor 104 may be much greater than the size of the p-type transistor $M_p$ or the n-type transistor $M_n$.

Figure 2:
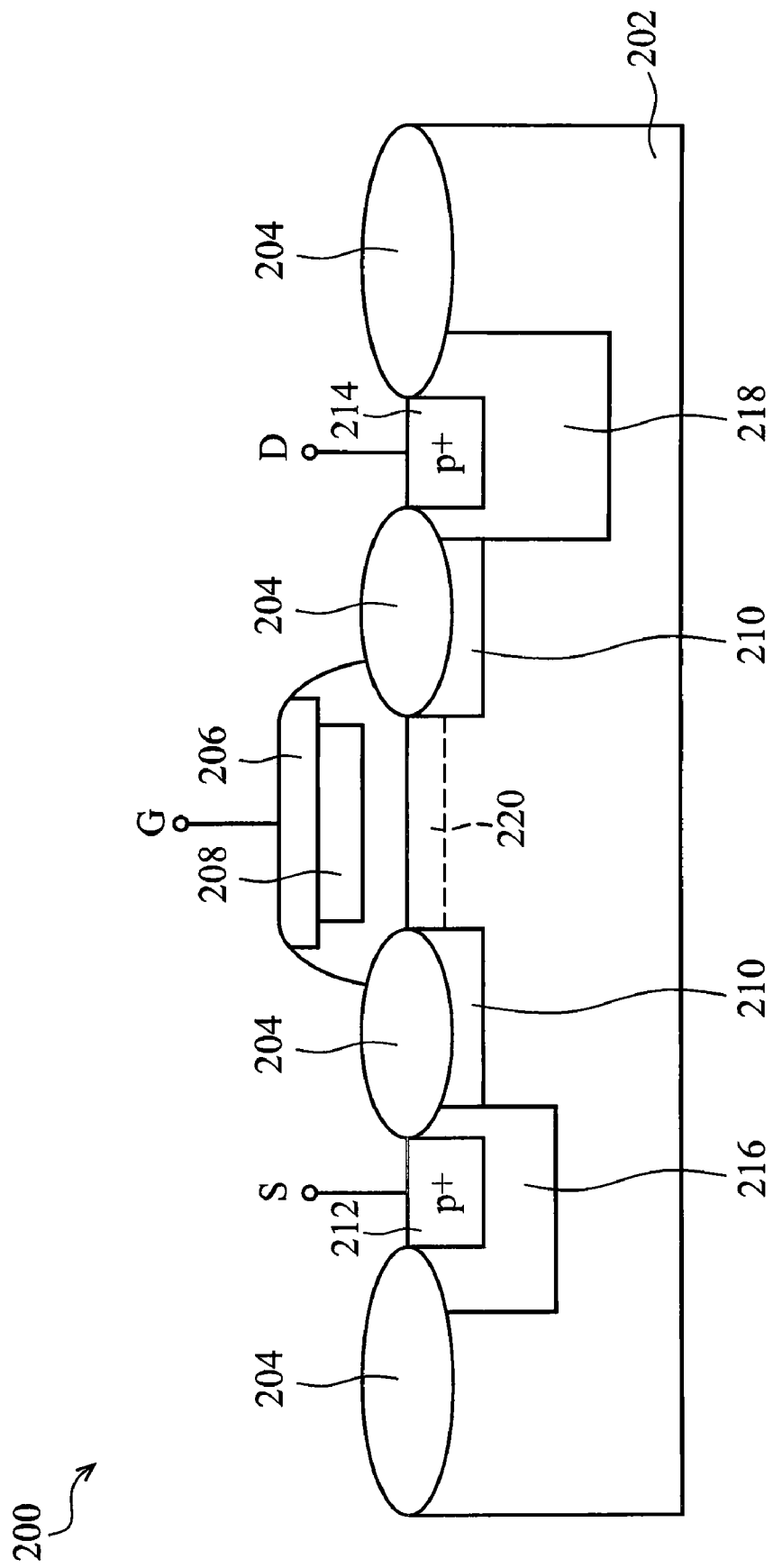
FIG. 2 depicts cross section of an exemplary embodiment of a p-type transistor of the ESD protection device of the invention.

In an exemplary embodiment of the ESD protection device of the invention, the structure of the p-type transistor $M_p$ of FIG. 1A or 1B is specially designed and is shown in FIG. 2. As the cross section shows in FIG. 2, the p-type transistor 200 comprises an n-type substrate 202, field oxides 204, a poly gate 206, an HV thin gate oxide 208, p-drifts 210, a first doping region 212, a second doping region 214, a third doping region 216 and a fourth doping region 218. The poly gate 206 and the HV thin gate oxide 208 form a gate G. The first and third doping regions 212 and 216 form a source S. The second and fourth doping regions 214 and 218 form a drain D. Comparing the first and third doping regions 212 and 216, the third doping region 216 has a greater doping depth and has a lower doping concentration. Comparing the second and fourth doping regions 214 and 218, the fourth doping region 218 has a greater doping depth and has a lower doping concentration.

The doping concentration of the fourth doping region 218 is less than that of the third doping region 216. In an exemplary embodiment, the third doping region 216 is a p-grade and the fourth doping region 218 is a p-well. Because the doping concentration of the p-well is less than that of the p-grade, the doping concentration of the fourth doping region 218 is less than that of the third doping region 216. Thus, a current generated under the channel 220 is controlled within an allowable value, and the ESD current mostly directed to the p-well 218 (which is at a high voltage level). Thus the transistor 200 is hindered from burnout since the current through the channel surface is controlled. In some exemplary embodiments, the doping depths of the third and fourth doping regions 216 and 218 may be carefully designed. As shown in FIG. 2, the doping depth of the fourth doping region 218 is greater than the doping depth of the third doping region 216. The resistance at the drain of the p-type transistor 200 may be increased by controlling the doping concentration and/or other manufacturing parameters of the third and fourth doping regions 216 and 218. Thus, ESD protection is dramatically improved.

Figure 3:
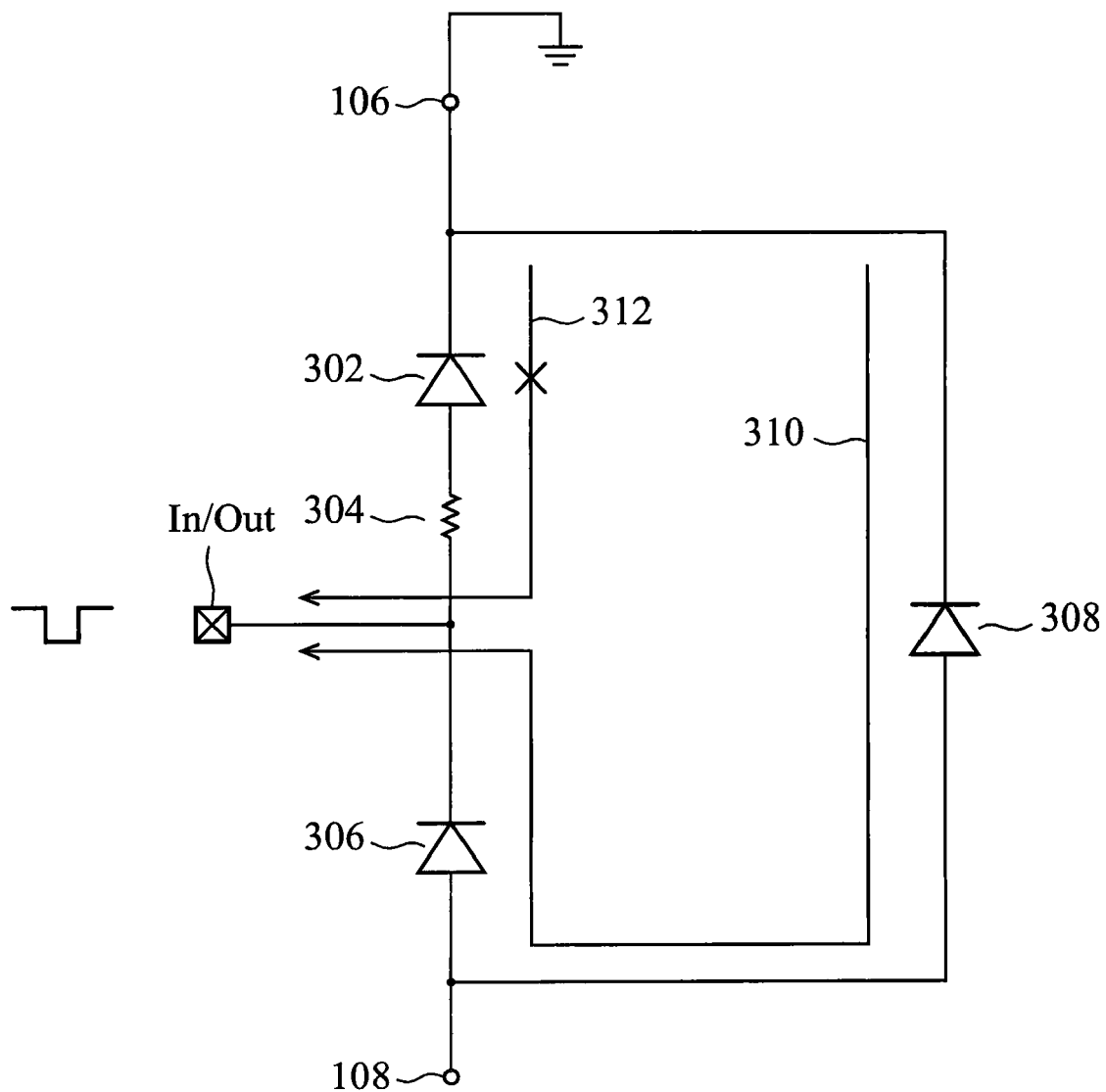
FIG. 3 simplifies the ESD protection devices of FIGS. 1A and 1B by diodes and resistors, wherein the p-type transistor $M_p$ is realized by the p-type transistor 200, and the circuit is in a ND mode ESD test.

FIG. 3 simplifies the ESD protection devices of FIGS. 1A and 1B by diodes and resistors, wherein the p-type transistor $M_p$ is realized by the p-type transistor 200, the IC pin equipped with the ESD protection device may be an input pin or an output pin and is labeled In/Out, and the circuit is in an ND mode ESD test. The diode 302 and resistor 304 represent the p-type transistor $M_p$ shown in FIGS. 1A and 1B and have a structure of FIG. 2. Diode 306 represents the n-type transistor $M_n$, of FIGS. 1A and 1B. Diode 308 represents the ESD clamp circuit 102 of FIGS. 1A and 1B. The size of the diode 308 is much greater than the size of the diode 302 or the diode 306. As shown, the ND mode ESD test forces a negative ESD test voltage at the input or output pin In/Out, grounds the voltage pin 106, and keeps the voltage pin 108 and the other pins of the chip in a floating state. An ESD current from the voltage pin 106 to the input or output pin In/Out is generated. As shown, the current path 310 is allowed but the current path 302 is blocked since the large-sized diode 308 allows current along the current path 310 but the resistor 304 (inherent in the p-type transistor disclosed in FIG. 2) reduces the current through the current path 312. Thus, the p-type transistor $M_p$ (represented by diode 302 and resistor 304) is protected from breakdown or being destroyed in a case wherein a huge voltage is applied thereon. The ESD device of the invention provides improved ESD protection ability.

Figure 4:
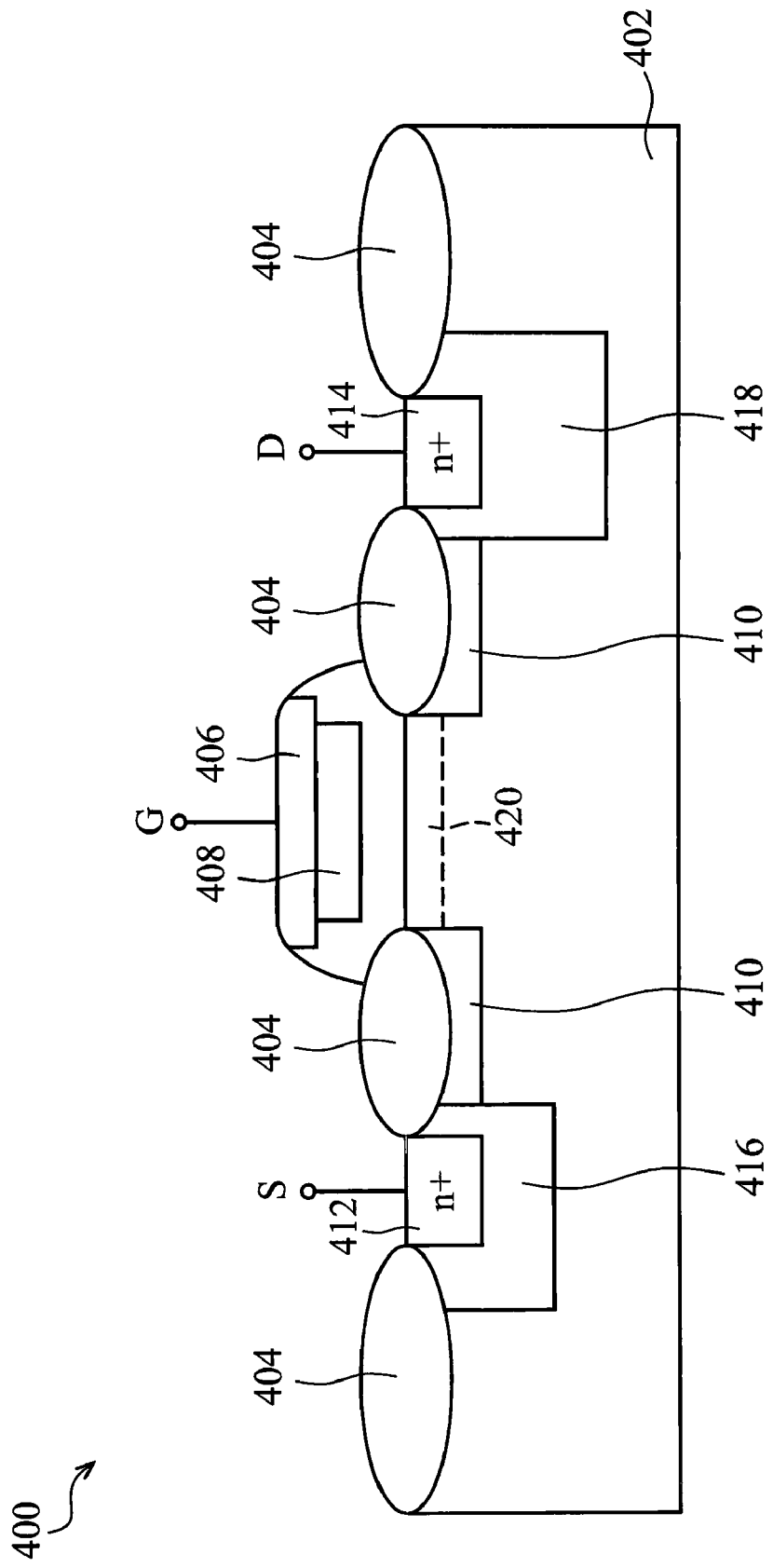
FIG. 4 depicts cross section of an exemplary embodiment of a n-type transistor of the ESD protection device of the invention.

In another exemplary embodiment of the ESD protection device of the invention, a special design is applied in the n-type transistor $M_n$ of FIGS. 1A and 1B and it is shown in FIG. 4. The n-type transistor 400 comprises a p-type substrate 402, field oxides 404, a poly-gate 406, an HV thin gate oxide 408, n-drifts 410, a first doping region 412, a second doping region 414, a third doping region 416 and a fourth doping region 418. The poly-gate 406 and HV thin gate oxide 408 form a gate G. The first and third doping regions 412 and 416 form a source S. The second and fourth doping regions 414 and 418 form a drain D. Comparing the first and third doping regions 412 and 416, the third doping region 416 has a greater doping depth and has a lower doping concentration. Comparing the second and fourth doping regions 414 and 418, the fourth doping region 418 has a greater doping depth and has a lower doping concentration.

In FIG. 4, the fourth doping region 418 is specially designed to have a doping concentration less than that of the third doping region 416. Thus, current under channel 420 is limited and an ESD current is mostly directed to the high voltage controlled fourth doping region 418. Thus, the device is mitigated from burnout since the current through the channel surface is controlled. The heat generated by power dissipation is uniformly distributed among the whole transistor. The third doping region 416 may be an n-grade and the fourth doping region 418 may be an n-well. The doping concentration of n-well is less than that of the n-grade. In some exemplary embodiments, the doping depth of the third and fourth doping regions 416 and 418 may be specially designed. As shown in FIG. 4, the doping depth of the fourth doping region 418 may be greater than the doping depth of the third doping region 416. The resistance at the drain of the n-type transistor 400 may be increased by controlling the doping concentrations and other manufacturing parameters of the third and fourth doping regions 416 and 418. Thus, ESD protection is dramatically improved.

Figure 5:
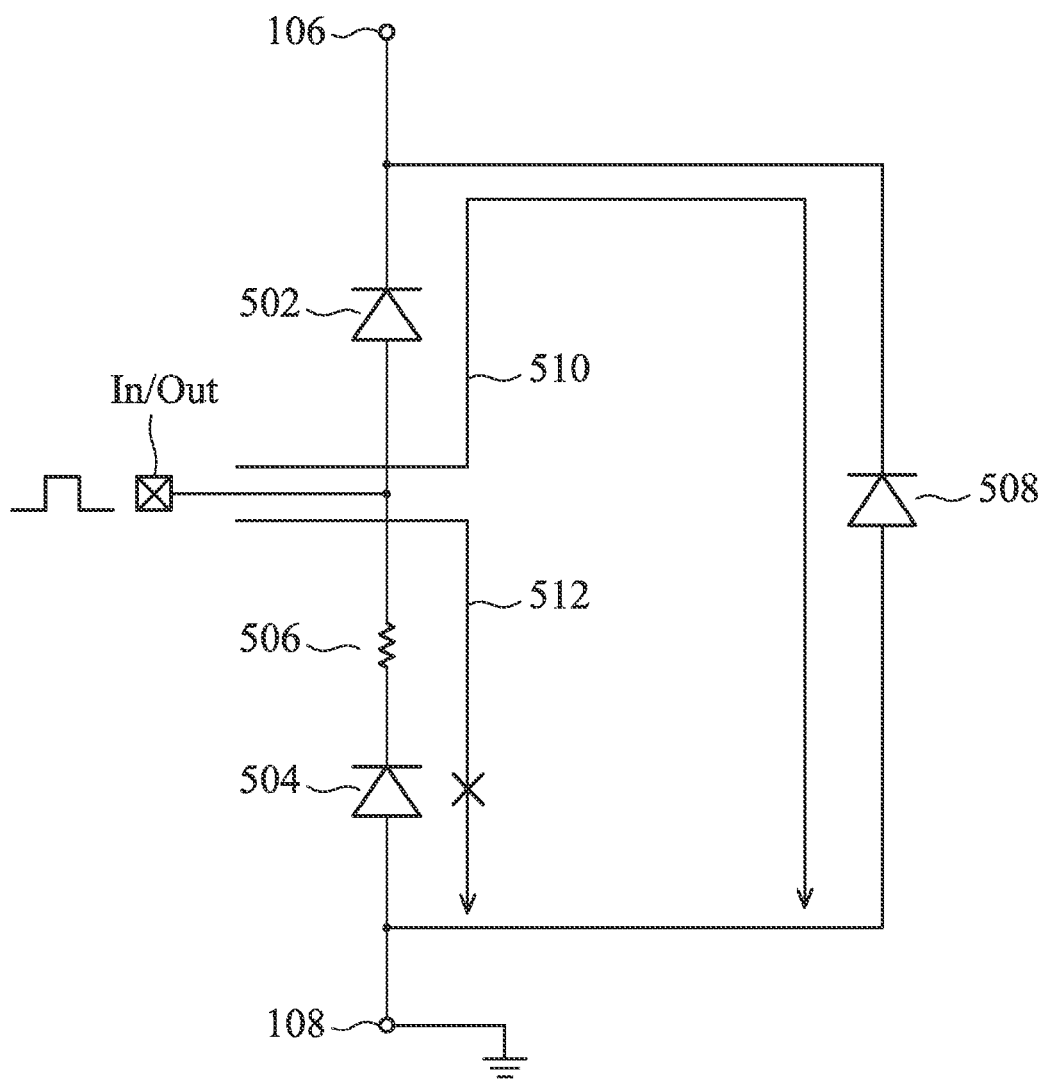
FIG. 5 simplifies the ESD protection devices of FIGS. 1A and 1B by diodes and resistors, wherein the n-type transistor $M_n$ is realized by the n-type transistor 400, and the circuit is in a PS mode ESD test.

FIG. 5 simplifies the ESD protection devices of FIGS. 1A and 1B by diodes and resistors, wherein the n-type transistor $M_n$ is realized by the n-type transistor 400, the IC pin equipped with the ESD protection device may be an input pin or an output pin and is labeled In/Out, and the circuit is in a PS mode ESD test. Diode 502 represents the p-type transistor $M_p$ shown in FIGS. 1A and 1B. Diode 504 and resistor 506 represent the n-type transistor $M_n$, shown in FIGS. 1A and 1B and having a structure of FIG. 4. Diode 508 represents the ESD clamp circuit 102 of FIGS. 1A and 1B. The size of the diode 508 is much greater than the size of the diodes 502 and 504. As shown, the PS mode ESD test forces a positive ESD test voltage at the input or output pin In/Out, grounds the voltage pin 108, and keeps the voltage pin 106 and the other pins in a floating status. Thus, an ESD current from the input or output pin In/Out to the voltage pin 108 is generated. As shown, the current path 510 is allowed but the current path 512 is blocked since the large-sized diode 508 allows current along the current path 510 but the resistor 506 (inherent in the n-type transistor disclosed in FIG. 4) reduced the current through the current path 512. Thus, the n-type transistor $M_n$ (represented by diode 504 and resistor 506) is protected from breakdown or being destroyed in a case wherein a huge voltage is applied thereon. The ESD protection device of the invention provides improved ESD protection ability.

To summarize, the invention discloses ESD protection devices with specially designed switching elements, wherein the doping concentrations applied in forming the switching elements are carefully designed. In an ND mode or PS mode ESD test, the ESD protection device of the invention routes the ESD current to pass through a predetermined current path. Compared to ESD protection device fabricated by conventional methods, the ESD protection device of the invention provides improved ESD protection ability and is more reliable. No additional masks are required to control the electronic characteristics of the switching elements to set the ESD current path.

Additionally, the large-sized ESD clamp circuit may be shared by more than one input or output pin of the chip. Thus, the size of the total chip may be dramatically reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection device applied in a chip, comprising:

a first transistor, wherein the first transistor includes a first gate, a first drain coupled to an input/output pin of the chip, and a first source coupled to a first voltage pin of the chip;

a second transistor coupled to the first transistor, wherein the second transistor includes a second gate, a second drain coupled to the input/output pin, and a second source coupled to a second voltage pin of the chip; and an electrostatic discharge clamp circuit coupled between the first and second voltage pins, wherein the first transistor has a first, a second, a third and a fourth doping regions, the first and third doping regions form the first source of the first transistor, a doping depth of the third doping region is more than a doping depth of the first doping region, and a doping concentration of the third doping region is less than a doping concentration of the first doping region, wherein the second and fourth doping regions form the first drain of the first transistor, a doping depth of the fourth doping region is more than a doping depth of the second doping region, and a doping concentration of the fourth doping region is less than a doping concentration of the second doping region, wherein the doping concentration of the fourth doping region is designed to be less than the doping concentration of the third doping region and the doping depth of the fourth doping region is more than the doping depth of the third doping region to control current path of an electrostatic discharge current.

2. The electrostatic discharge protection device as claimed in claim 1, wherein the first transistor is a p-type transistor and the second transistor is an n-type transistor and, when the input/output pin is fed a negative voltage and the first voltage pin is grounded, the first transistor reduces current passing therethrough and the electrostatic discharge current is routed from the first voltage pin to the electrostatic discharge clamp circuit to the second transistor and finally to the input/output pin.

3. The electrostatic discharge protection device as claimed in claim 1, wherein the third doping region includes a p-grade region and the fourth doping region includes a p-well region.

4. The electrostatic discharge protection device as claimed in claim 1, wherein the first transistor is an n-type transistor and the second transistor is an p-type transistor and, when the input/output pin is fed a positive voltage and the first voltage pin is grounded, the first transistor reduces current passing therethrough and the electrostatic discharge current is routed from the input/output pin to the second transistor to the electrostatic discharge clamp circuit and finally to the first voltage pin.

5. The electrostatic discharge protection device as claimed in claim 1, wherein the third doping region includes an n-grade region and the fourth doping region includes an n-well region.

6. The electrostatic discharge protection device as claimed in claim 1, wherein the electrostatic discharge clamp circuit includes a third transistor coupled between the first and second voltage pins and the third transistor is in a size larger than the first or second transistor.

* * * * *